(12) United States Patent
Murakami et al.

(10) Patent No.: US 8,431,494 B2
(45) Date of Patent: Apr. 30, 2013

(54) FILM FORMATION METHOD AND FILM FORMATION APPARATUS

(75) Inventors: Hiroki Murakami, Nirasaki (JP); Kazuhide Hasebe, Nirasaki (JP); Kazuya Yamamoto, Nirasaki (JP); Toshihiko Takahashi, Nirasaki (JP); Daisuke Suzuki, Nirasaki (JP)

(73) Assignee: Tokyo Electron Limited (JP)

(*) Notice: Subject to any disclaimer, the term of this patent is extended or adjusted under 35 U.S.C. 154(b) by 0 days.

(21) Appl. No.: 13/164,280

(22) Filed: Jun. 20, 2011

(65) Prior Publication Data

US 2011/0312192 A1    Dec. 22, 2011

(30) Foreign Application Priority Data

Jun. 22, 2010  (JP) ................ 2010-142076
May 17, 2011  (JP) ................ 2011-110029

(51) Int. Cl.
  *H01L 21/469*  (2006.01)
  *H01L 21/316*  (2006.01)

(52) U.S. Cl.
  USPC ............ 438/770; 438/787; 257/E21.274

(58) Field of Classification Search .......... 438/765–774, 438/778, 780, 787–790; 257/E21.274; 118/725
See application file for complete search history.

(56) References Cited

U.S. PATENT DOCUMENTS

| 2001/0024387 A1* | 9/2001 | Raaijmakers et al. ........ 365/200 |
| 2007/0210365 A1* | 9/2007 | Togashi et al. ................ 257/296 |

FOREIGN PATENT DOCUMENTS

| JP | 2004-039990 | 2/2004 |
| JP | 2006-054432 | 2/2006 |
| JP | 2006-066587 | 3/2006 |
| JP | 2006-287194 | 10/2006 |

\* cited by examiner

*Primary Examiner* — Charles Garber
*Assistant Examiner* — Calvin Choi
(74) *Attorney, Agent, or Firm* — Cantor Colburn LLP

(57) ABSTRACT

A film formation method of forming a silicon oxide film on a surface of an object to be processed in a process chamber includes absorbing a seed gas comprising a silane-based gas on the surface of the object to be processed by supplying the seed gas into the process chamber, forming a silicon film having an impurity by supplying a silicon-containing gas as a material gas, and an addition gas including the impurity into the process chamber, and oxidizing the silicon film to convert the silicon film into the silicon oxide film. Accordingly, the silicon oxide film having the high density and the high stress is formed on the surface of the object to be processed.

6 Claims, 8 Drawing Sheets

FILM FORMATION METHOD AND FILM FORMATION APPARATUS

CROSS-REFERENCE TO RELATED PATENT APPLICATIONS

This application claims the benefits of Japanese Patent Application No. 2010-142076, filed on Jun. 22, 2010 and Japanese Patent Application No. 2011-110029, filed on May 17, 2011 in the Japan Patent Office, the disclosures of which are incorporated herein in its entirety by reference.

BACKGROUND OF THE INVENTION

1. Field of the Invention

The present invention relates to a film formation method and a film formation apparatus for forming a silicon oxide film on an object to be processed, such as a semiconductor wafer, or the like.

2. Description of the Related Art

Generally, in order to manufacture a semiconductor integrated circuit, various heat treatments, such as a film formation process, an etching process, an oxidation process, a diffusion process, a modifying process, etc., are performed on a semiconductor wafer, such as a silicon substrate, or the like. The heat treatments are performed by using a so-called single type process apparatus that processes a single wafer at a time, or a so-called batch type process apparatus that processes a plurality of wafers at the same time. A method of forming a silicon oxide film, from among the various heat treatments, is frequently performed because a silicon oxide film is often used as a gate insulation film of a transistor device in a semiconductor integrated circuit, or an insulation film or an interlayer insulation film of a capacitor or a nonvolatile floating gate.

The silicon oxide film is formed by generally using TEOS (Tetraethyl Orthosilicate) or a silane-based gas as a raw material, and by using a CVD (Chemical Vapor Deposition) method or an ALD (Atomic Layer Deposition) method. As another film formation method, a method of forming a silicon oxide film by forming an amorphous silicon film by using a thermal decomposition method or CVD method, and then contacting the amorphous silicon film with a gas including an oxygen atom, is also well known (Patent Reference 1).

3. Prior Art Reference (Patent Reference 1) Japanese Patent Laid-Open Publication No. 2006-066587

SUMMARY OF THE INVENTION

However, due to many requests to highly integrate, highly miniaturize, and highly thin a semiconductor integrated circuit, a line width, a pattern width, or a recessed and protruded portion width of a wafer surface is miniaturized. Thus, it is required to miniaturize a design size of the line width, the pattern width, or the recessed and protruded portion width of the wafer surface to about dozens of nm.

Also, a process of filling minute recessed portions by depositing a silicon oxide film on a minutely recessed and protruded surface of a wafer surface may be performed, but at this time, a pattern of the recessed and protruded surface may be deformed due to a stress of the silicon oxide film. In detail, FIGS. 6A and 6B are magnified views showing a state when a silicon oxide film is formed on a surface of a semiconductor wafer having a recessed and protruded surface. FIG. 6A is a magnified view showing a part of a semiconductor wafer, for example, such as a silicon substrate, wherein minute recessed portions 2 and minute protruded portions 4 are continuously formed on a surface of the semiconductor wafer W. A width L1 of the recessed portion 2 and a width L2 of the protruded portion 4 are both less than or equal to about 20 to 30 nm, which are very minute sizes.

Also, when a silicon oxide film 6 is formed on the recessed and protruded surface of the semiconductor wafer W as shown in FIG. 6B by using a general thermal CVD method, an ALD method that forms a film by alternately flowing a material gas and a reaction gas, or the like, the protruded portion 4 bends due to a stress of the silicon oxide film 6, and thus the recessed and protruded pattern is deformed.

As such, when the recessed and protruded pattern is deformed, neighboring protruded portions 4 may contact each other, thereby generating a short-circuit, or the recessed portions 2 may not be sufficiently filled. Specifically, when a silicon oxide film is formed by using the ALD method or the CVD method on silicon, crystalline nucleus may dispersively grow, thereby deteriorating surface roughness.

To solve the above problems, the present invention provides a film formation method and a film formation apparatus for forming a silicon oxide film having a high density and a high stress on a surface of an object to be processed.

According to an aspect of the present invention, there is provided a film formation method of forming a silicon oxide film on a surface of an object to be processed in a process chamber, the film formation method including: adsorbing a seed gas comprising a silane-based gas on the surface of the object to be processed by supplying the seed gas into the process chamber; forming a silicon film having an impurity by supplying a silicon-containing gas as a material gas, and an addition gas including the impurity into the process chamber; and oxidizing the silicon film to convert the silicon film into the silicon oxide film.

According to another aspect of the present invention, there is provided a film formation apparatus which forms a silicon oxide film on a surface of an object to be processed, the film formation apparatus including: a process chamber which is able to be evacuated; a holding unit which holds the object to be processed in the process chamber; a gas supply unit which supplies a gas into the process chamber; a heating unit which heats the object to be processed; and a controller which controls the entire apparatus so as to perform the film formation method.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
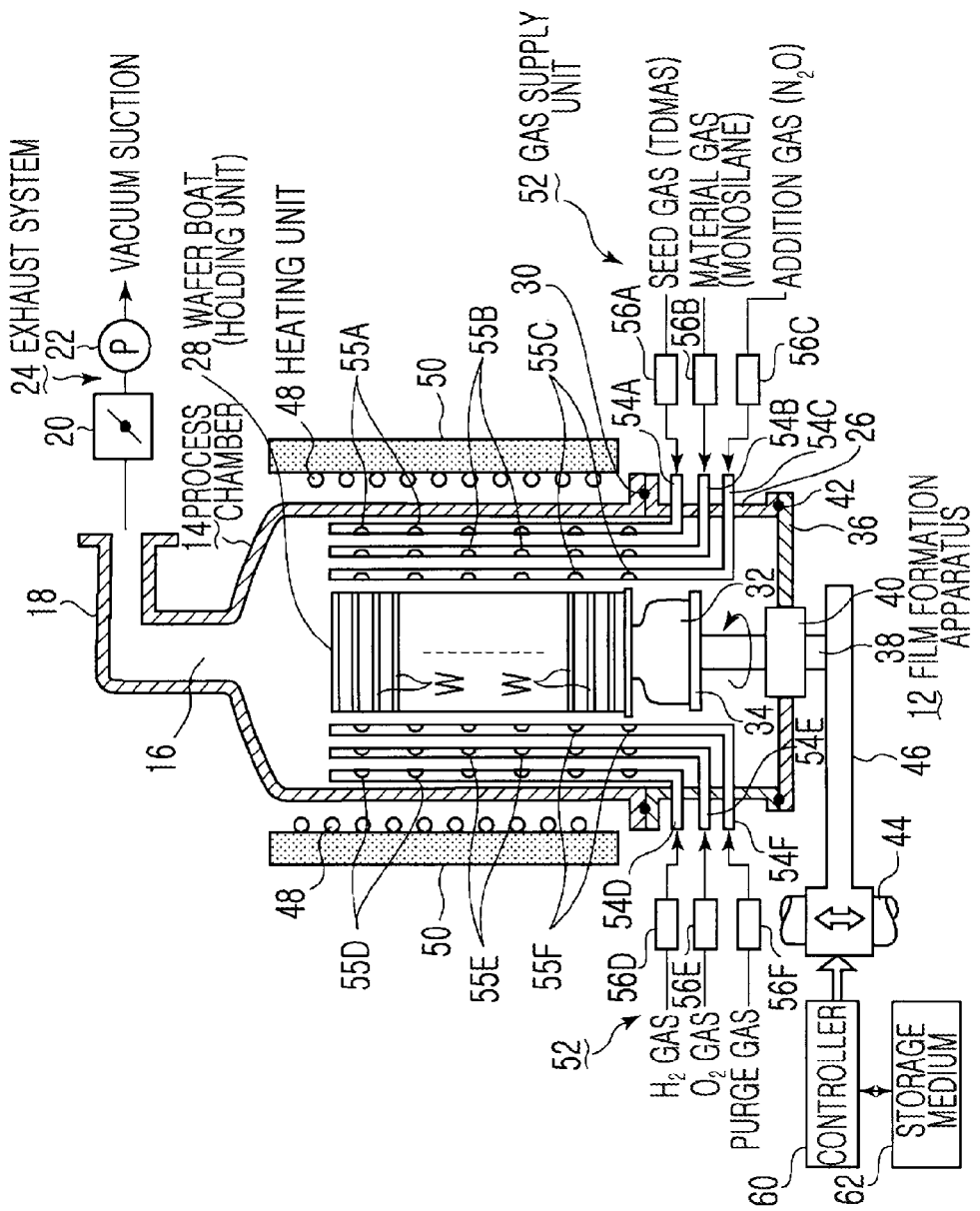
FIG. 1 is a structural view showing an example of a film formation apparatus of the present invention.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Hereinafter, embodiments of a film formation method and a film formation apparatus according to the present invention will be described with reference to attached drawings. FIG. 1 is a structural view showing an example of a film formation apparatus of the present invention. First, the film formation apparatus will be described. As shown in FIG. 1, a film formation apparatus 12 includes a process chamber 14 of a cylindrical body shape having an opened bottom. The process chamber 14, for example, may be formed of quartz having a high heat resistance.

An exhaust port 16 that is open is provided at a ceiling portion of the process chamber 14, while an exhaust nozzle 18 that is, for example, laterally bent at a right angle is continuously provided to the exhaust port 16. Also, an exhaust system 24 including a pressure control valve 20, a vacuum pump 22 or the like is connected to the exhaust nozzle 18, thereby allowing an atmosphere inside the process chamber 14 to be vacuum-evacuated. Also, an inside of the process chamber 14 may have a vacuum atmosphere or an approximately normal pressure atmosphere according to process types.

The bottom of the process chamber 14 is supported by a manifold 26 having, for example, a cylindrical shape formed of stainless steel, and a wafer boat 28 formed of quartz is configured to be elevatable from a lower portion of the manifold 26 and be freely inserted into or be pulled out from the process chamber 14, wherein the wafer boat 28 is a holding unit for holding a plurality of semiconductor wafers W as objects to be processed in a multistage manner. A seal member 30 such as an O-ring or the like is disposed between the bottom of the process chamber 14 and a top of the manifold 26, thereby maintaining air-tightness therebetween. According to the present embodiment, the wafer boat 28 may support, for example, about 50 semiconductor wafers W having a diameter of 300 mm in a multistage manner at about equal pitches.

The wafer boat 28 is placed on a table 34 while a quartz thermo-container 32 is interposed therebetween, and the table 34 is supported on a top of a rotation shaft 38 that penetrates through a cover 36 for opening and closing a bottom opening of the manifold 26. Also, for example, a magnetic fluid seal 40 is provided at a portion of the rotation shaft 38 that penetrates through the cover 36, so as to tightly seal the rotation shaft 38 while rotatably supporting the rotation shaft 38. Also, a seal member 42, for example, such as an O-ring or the like, is provided at a periphery portion of the cover 36 and a bottom portion of the manifold 26, thereby maintaining sealability inside the process chamber 14.

The rotation shaft 38 is attached to a leading end of an arm 46 extending from an elevating mechanism 44, for example, such as a boat elevator or the like, and configured to integrally elevate the wafer boat 28, the cover 36, etc. Alternatively, the table 34 is fixed and installed to the cover 36 so that the semiconductor wafers W may be processed without rotating the wafer boat 28.

A heating unit 48 such as a heater including carbon wire is installed to surround sides of the process chamber 14, so as to heat the semiconductor wafers W held inside the process chamber 14. Also, an insulator 50 is installed on an outer circumference of the heating unit 48 so as to obtain thermal stability of the heating unit 48. Also, a gas supply unit 52 for introducing and supplying various gases into the process chamber 14 is installed at the manifold 26. In detail, 6 gas nozzles 54A, 54B, 54C, 54D, 54E, and 54F that penetrate through side walls of the manifold 26 are installed as the gas supply unit 52 in the shown embodiment.

Each of the gas nozzles 54A through 54F extends upward inside the process chamber 14, a plurality of gas ejection holes 55A, 55B, 55C, 55D, 55E, and 55F are respectively provided to the gas nozzles 54A through 54F at predetermined intervals along a lengthwise direction, and each gas may be emitted in a horizontal direction from the gas ejection holes 55A through 55F.

Here, for example, a seed gas comprising a silane-based gas, a silicon-containing gas as a material gas, an addition gas including an impurity, a hydrogen gas, an oxygen gas, and a purge gas may be supplied respectively from the gas nozzles 54A through 54F at a controlled flow rate, if necessary. In detail, gas controllers 56A through 56F including a flow controller such as a mass flow controller or an opening/closing valve are connected to the gas nozzles 54A through 54F, respectively.

Entire operations of the film formation apparatus 12 configured as such are controlled by a controller 60, for example, such as a computer or the like, and a program of the computer for performing the operations is stored in a storage medium 62. The storage medium 62 may be, for example, a flexible disc, a CD (Compact Disc), a hard disc, a flash memory, a DVD, or the like. In detail, starting and stopping of supply of each gas and gas flow rates are individually controlled according to a command from the controller 60.

Next, a film formation method of the present invention performed by using the film formation apparatus 12 configured as above will be described.

First, the process chamber 14 maintains a temperature lower than a process temperature when the film formation apparatus 12 is in a standby state while the semiconductor wafers W, for example, such as silicon wafers, are unloaded. The wafer boat 28, on which a plurality, for example, 50, of the semiconductor wafers W are placed at room temperature, is elevated from the bottom of the process chamber 14 and loaded into the process chamber 14, and the bottom opening of the manifold 26 is closed by using the cover 36 so as to seal the inside of the process chamber 14.

Also, vacuum suction is performed in the process chamber 14 such that the process chamber 14 is maintained at a predetermined process pressure while increasing power supplied to the heating unit 48, thereby increasing a wafer temperature up to a process temperature and stabilizing the wafer temperature at the process temperature for film formation, i.e., an adsorption temperature of the seed gas. Then, predetermined process gases, which are required in each process, are supplied into the process container 14 from the gas nozzles 54A through 54F of the gas supply unit 52 while controlling flow rates of the predetermined process gases.

The process gases are emitted in a horizontal direction from each of the gas ejection holes 55A through 55F, and corresponding processes are performed on a wafer surface by the process gases contacting with the semiconductor wafers W held by the wafer boat 28 while rotating the wafer boat 28. Then, the process gases or a gas generated by reaction is evacuated outside a system from the exhaust port 16 of the ceiling portion of the process chamber 14.

Figure 2:
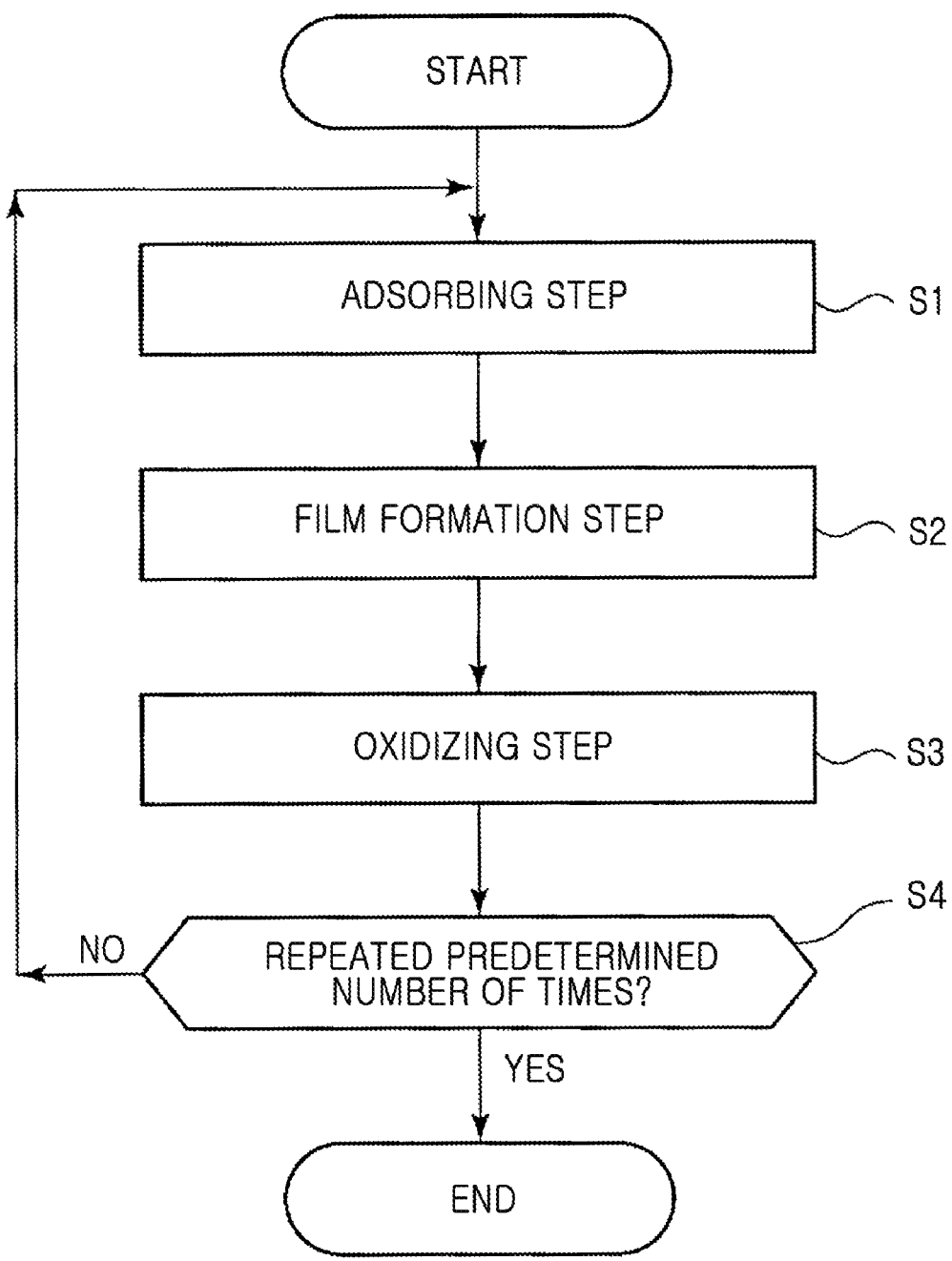
FIG. 2 is a flowchart showing each step of a method of the present invention.
Figure 3:
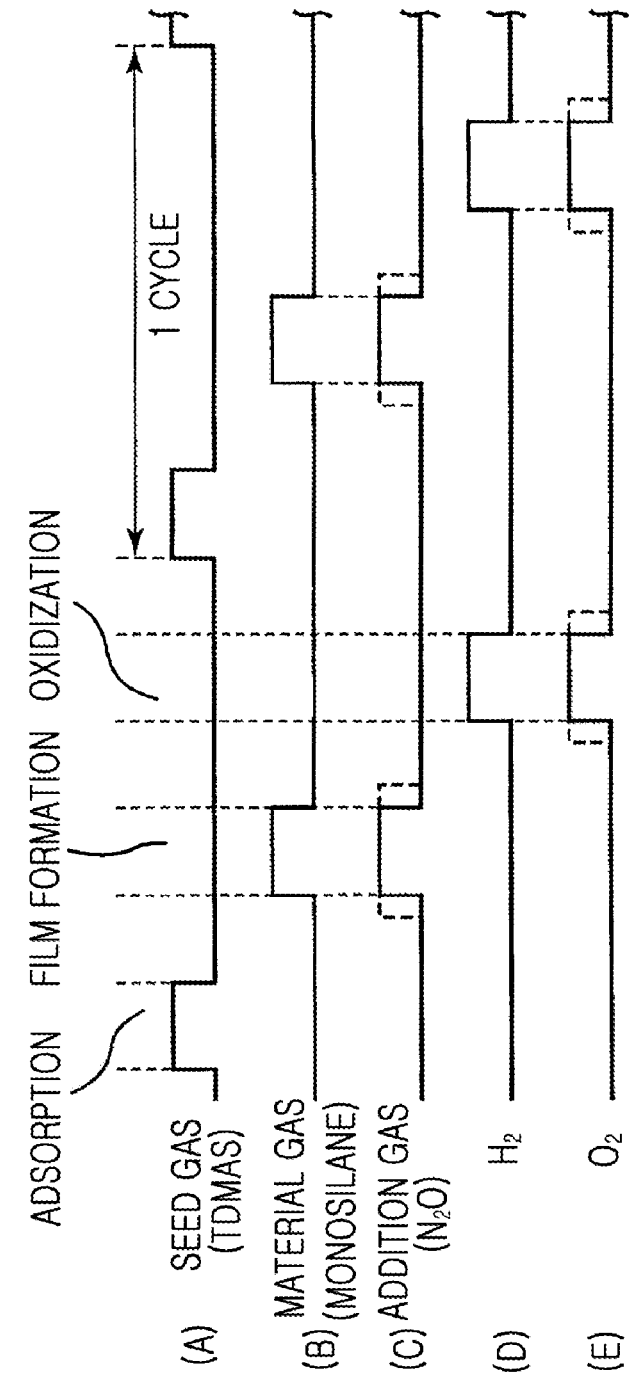
FIG. 3 is a timing chart showing supply timing of each gas.
Figure 4:
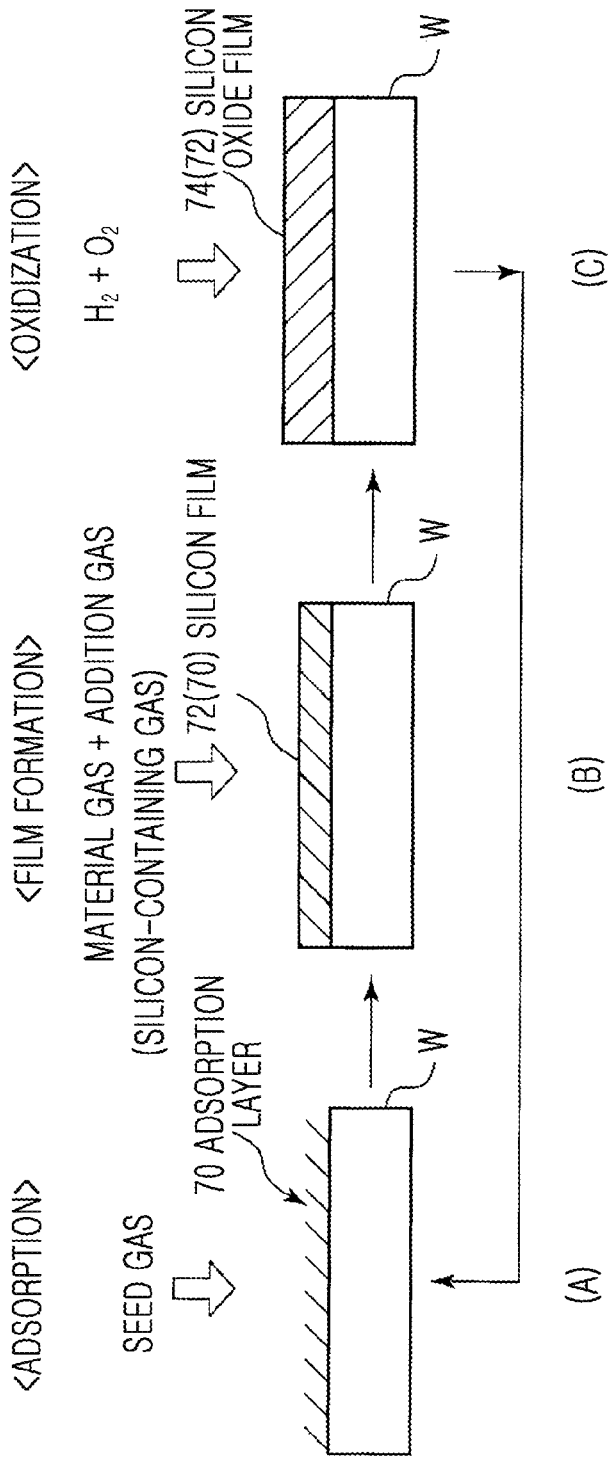
FIG. 4 is a view schematically showing processes of each step of the method of the present invention.

Next, each process performed on the surface of the semiconductor wafers W will be described in detail with reference to FIGS. 2 through 4. Here, a film formation method will be described. FIG. 2 is a flowchart showing each step of a method of the present invention, FIG. 3 is a timing chart showing supply timing of each gas, and FIG. 4 is a view schematically showing processes of each step of the method of the present invention. Here, a silicon oxide film is formed on the surface of the semiconductor wafers W such as objects to be processed. In detail, according to the present invention, an adsorbing step of adsorbing a seed gas comprising a silane-based gas on the surface of the semiconductor wafers W by supplying the seed gas into the process chamber 14, a film formation step of forming a silicon film having an impurity by supplying a silicon-containing gas as a material gas, and an addition gas including the impurity into the process chamber 14, and an oxidizing step of oxidizing the silicon film to convert the silicon film into a silicon oxide film, are repeatedly performed in the stated order.

The semiconductor wafers W may each be, for example, a silicon substrate as described with reference to FIGS. 6A and 6B. In other words, for example, as described above with reference to FIGS. 6A and 6B, the surface of the semiconductor wafers W has a recessed and protruded surface including recessed portions 2 or protruded portions 4. A width L1 of the recessed portion 2 and a width L2 of the protruded portion 4 are both less than or equal to about 20 to 30 nm, and an aspect ratio is, for example, about 1 to 20.

First, as shown in (A) of FIG. 3 and (A) of FIG. 4, the adsorbing step of adsorbing a seed gas comprising a silane-based gas on the surface of the semiconductor wafers W by supplying the seed gas into the process chamber 14 is performed (step S1 of FIG. 2). Accordingly, an adsorption layer 70 of the seed gas is formed on the surface of the semiconductor wafers W. A thickness of the adsorption layer 70 is about a thickness of a molecular level of the seed gas, for example, about 0.1 nm, and the seed gas is almost uniformly adsorbed on the surface of the semiconductor wafers W regardless of a type of a base. Specifically, in FIGS. 6A and 6B, the seed gas is almost uniformly adsorbed on a side of the recessed portions 2 or a bottom surface inside the recessed portions 2. The adsorption layer 70 operates as a seed film while forming a film in a following step.

The seed gas is ejected and supplied into the process chamber 14 from each of the gas ejection holes 55A of the gas nozzle 54A of the gas supply unit 52 at a controlled flow rate. Here, an amino silane-based gas, for example, is used as the silane-based gas of the seed gas, and in detail, trisdimethylaminosilane (TDMAS) is used. Regarding process conditions at this time, a process temperature is within the range from 300 to 600° C., a process pressure is within the range from 0.1 to 5 Torr (1 Torr=133.3 Pa), and the flow rate of the seed gas is within the range from 10 to 500 sccm. Also, a process time is within the range from 10 to 300 sec. One of reasons for supplying the silane-based gas is to improve roughness of a silicon film formed in a following step.

Next, as shown in (B) and (C) of FIG. 3, and (B) of FIG. 4, the film formation step of forming a silicon film 72 having an impurity by supplying a silicon-containing gas as a material gas, and an addition gas including the impurity into the process chamber 14 is performed (step S2 of FIG. 2). Here, the silicon-containing gas as the material gas, and the addition gas are thermally decomposed to form the silicon film 72, and at this time, the silicon film 72 grows while the absorption layer 70 of the seed gas operates as a seed. Here, regarding a method of supplying a gas, the silicon-containing gas as the material gas, and the addition gas may be simultaneously supplied or alternately supplied. Also, as shown in broken lines in (C) of FIG. 3, the supply of the addition gas may be started before supplying the material gas and may be continued after the supply of the material gas is stopped.

Also, during the film formation, the addition gas is decomposed, and thus a certain amount of the impurity in the addition gas is introduced into the silicon film 72. As such, during the film formation, the impurity is introduced in as described above, and thus the silicon film 72 in an amorphous state may be formed by suppressing crystallization of a deposition film, and at the same time, roughness of a surface is not deteriorated.

The material gas is ejected and supplied into the process chamber 14 from each gas ejection hole 55B of the gas nozzle 54B of the gas supply unit 52 at a controlled flow rate, and the addition gas is ejected and supplied into the process chamber 14 from each gas ejection hole 55C of the gas nozzle 54C at a controlled flow rate.

The silicon-containing gas as the material gas may be a silane-based gas, and here, may be monosilane. Also, an $N_2O$ gas, i.e., a type of nitrogen oxide-based gas, is used as the addition gas. Here, oxygen components in the $N_2O$ gas are the impurity, and a very small amount of oxygen is introduced into the silicon film 72. Also, nitrogen components in the $N_2O$ gas become a gas and are evacuated. As such, since only a very small amount of impurity, for example, oxygen components, is introduced into the silicon film 72, crystallization of a deposited film is suppressed as described above, and moreover, a grain size is miniaturized, thereby improving roughness.

Regarding process conditions at this time, a process temperature is within the range from 500 to 600° C., a process pressure is within the range from 0.1 to 1 Torr, the flow rate of the silicon-containing gas as the material gas is within the range from 50 to 5000 sccm, and the flow rate of the addition gas is within the range from 5 to 50 sccm. Also, a process time is within the range from 10 to 300 sec. In addition, a thickness of the silicon film 72 formed at this time is, for example, within the range from 0.5 to 2 nm.

Next, as shown in (D) and (E) FIG. 3 and (C) of FIG. 4, the oxidizing step of forming a silicon oxide film 74 by entirely oxidizing the silicon film 72 is performed (step S3 of FIG. 2). Accordingly, the silicon film 72 is completely changed to an oxide film. Here, an oxidizing process using active species of oxygen is performed as the oxidizing step. There is a method of using oxygen plasma, a method of using ozone ($O_3$), a method of generating oxygen radicals and hydroxyl radicals by reacting an $H_2$ gas and an $O_2$ gas under a depressurized atmosphere or the like as the method of oxidizing process, but herein, the method of generating oxygen radicals and hydroxyl radicals by using an $H_2$ gas and an $O_2$ gas is employed. Here, regarding a method of supplying a gas, the $H_2$ gas and the $O_2$ gas may be simultaneously supplied or alternately supplied. Also, as shown in broken lines in FIG. 3(E), the supply of the $O_2$ gas may be started before supplying the $H_2$ gas and may be continued after the supply of the $H_2$ gas is stopped.

In detail, a $H_2$ gas is ejected and supplied into the process chamber 14 from each gas ejection hole 55D of the gas nozzle 54D of the gas supply unit 52 at a controlled flow rate, and an O₂ gas is ejected and supplied into the process chamber 14 from each gas ejection hole 55E of the gas nozzle 54E at a controlled flow rate. Regarding process conditions at this time, a process temperature is within the range from 500 to 600° C., a process pressure is within the range from 0.1 to 10 Torr, preferably within the range from 0.1 to 1 Torr, the flow rate of the H₂ gas is within the range from 100 to 1000 sccm, and the flow rate of the O₂ gas is within the range from 500 to 5000 sccm. Here, a temperature T1 of the adsorbing step, a temperature T2 of the film formation step, and a temperature T3 of the oxidizing step may be different from one another, but preferably set to the same temperature so as to improve throughput. Also, a purging step for evacuating a remaining atmosphere in the process chamber 14 may be or may not be performed between each of the adsorbing step, the film formation step, and the oxidizing step. Also, 1 cycle is from starting of one adsorbing step to starting of a next adsorbing step.

As such, by introducing hydrogen and oxygen separately into the process chamber 14 under a depressurized atmosphere, a following combustion reaction of hydrogen occurs nearest to the wafers W, as shown in Japanese Patent Laid-Open Publication No. 2004-039990. Also, in following expressions, a chemical symbol with * denotes an active species.

$$H_2+O_2 \rightarrow H^*+HO_2$$

$$O_2+H^* \rightarrow OH^*+O^*$$

$$H_2+O^* \rightarrow H^*+OH^*$$

$$H_2+OH^* \rightarrow H^*+H_2O$$

As such, when H₂ and O₂ are separately introduced into the process chamber 14, O* (oxygen active species), OH* (hydroxyl active species), and H₂O (vapor) are generated during the combustion reaction of hydrogen, and thus the silicon film 72 of the wafer surface is oxidized by O*, OH*, and H₂O, thereby forming the silicon oxide film 74. The oxidization is performed by using a gas including active species as described above, because a temperature change time may be reduced by performing the oxidization at a relatively low temperature of 500 to 600° C. if a series of manipulations that causes a temperature to approach a silicon film formation temperature is performed in the same process chamber. Also, thermal budget at the time of manufacturing a device may be reduced.

Then, it is determined whether steps S1 through S3 have been performed by repeating only a predetermined number of times in the stated order (step S4 of FIG. 4), and if "NO" (NO of step S4), process flow returns to step S1 and steps S1 through S3 are performed again. Alternatively, if the cycle has been performed the predetermined number of times by repeating steps S1 through S3 (YES of step S4), the film formation process ends. The number of times steps S1 through S3 are to be repeated (number of cycles) depends on thickness of a film to be formed, and for example, is from about 25 to about 100 times. A film thickness of the silicon oxide film 74 obtained at this time is, for example, in the range from 5 to 20 nm.

Figure 6A:
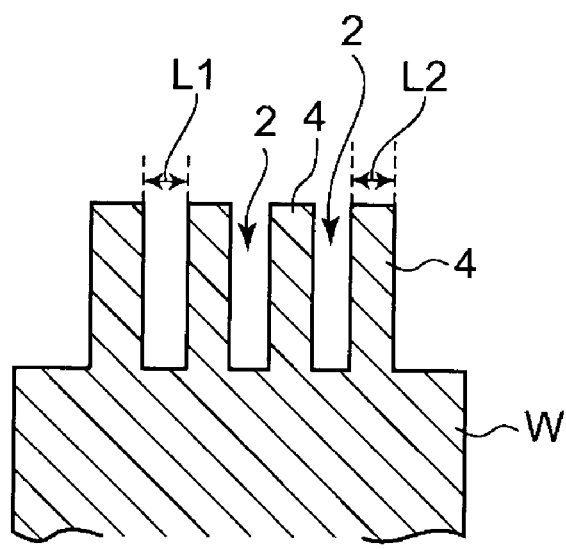
FIGS. 6A and 6B are magnified views showing a state when a silicon oxide film is formed on a surface of a semiconductor wafer having a recessed and protruded surface.
Figure 6B:
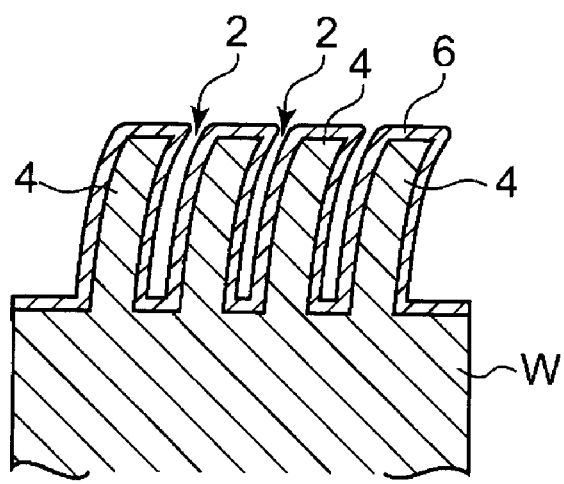

Accordingly, the silicon oxide film 74 may be formed while the recessed portions 2 shown in FIGS. 6A and 6B are sufficiently filled in. Also, film quality of the silicon oxide film 74 formed as such is a very high density, and moreover, a stress of the film was able to improve up to, for example, 200 MPa or more. In this regard, since a stress of a silicon oxide film formed by using a chemical vapor method, such as a conventional thermal CVD method, a conventional ALD method, or the like, is barely about 100 MPa, the stress of the film was able to improve at least almost 2 times that of a silicon oxide film formed by using a conventional film formation method.

As a result, since the stress of the silicon oxide film deposited on a side of the protruded portion 4, i.e., an inner wall surface of the recessed portion 2 shown in FIGS. 6A and 6B, may improve at least two times during film formation as described above, both sides of the protruded portion 4 are strongly pushed and tightened by the silicon oxide film having a high stress, and thus the protruded portion 4 is stopped from being bent or deformed, thereby preventing the recessed and protruded pattern from being deformed.

Also, before the film formation, the seed gas is uniformly adsorbed to the surface of the semiconductor wafers W during the adsorbing step, and thus a thin film is prevented from being dispersively attached during a silicon film formation step, thereby improving roughness of the surface. Also, since the addition gas including the impurity is slightly added to the material gas while forming the silicon film 72 during the film formation step, crystallization of the silicon film 72 is suppressed by an effect of the impurity so that the silicon film 72 may maintain an amorphous state, and furthermore, the roughness of the surface is more improved according to synergy with a seed effect of the material gas adsorbed during the previous adsorbing step. Also, if each process temperature of the adsorbing step, the film formation step, and the oxidizing step is set to the same temperature, for example, 550° C., or the like, manipulations for elevating or lowering the temperature of the semiconductor wafers W are not required during each step, and thus throughput is improved accordingly.

As described above, according to the present invention, it is possible to form a silicon oxide film having a high density and a high stress on a surface of a semiconductor wafer W, and as a result, for example, when a minutely recessed and protruded pattern exists on the surface of the semiconductor wafer W, deformation of the recessed and protruded pattern may be suppressed.

<Evaluation of the Method of the Present Invention>

Figure 5A:
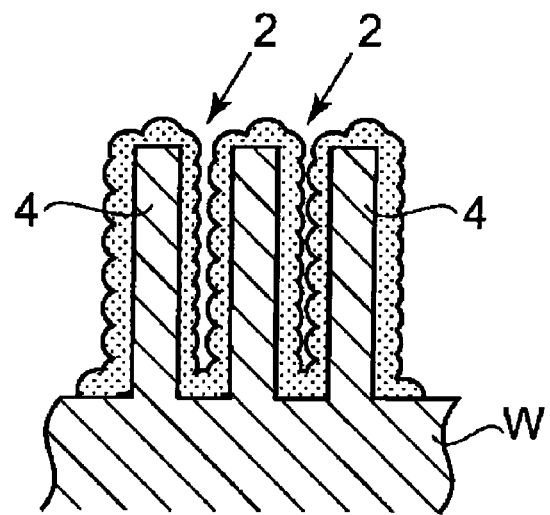
FIGS. 5A and 5B are views schematically showing evaluation results when a film is formed by using the method of the present invention and a comparative example.
Figure 5B:
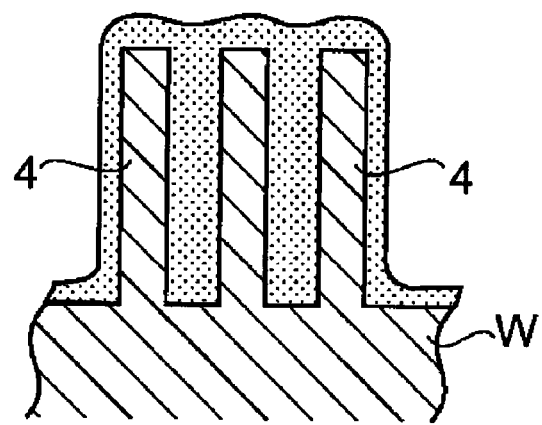

Next, after a silicon oxide film is formed by using the film formation method of the present invention, results of evaluating the silicon oxide film will be described. Here, the silicon oxide film is formed by using the film formation method described above. Types of gases and process conditions used for the evaluation have been described above. Also, the width L1 of the recessed portion 2 (refer to FIGS. 6A and 6B) on a semiconductor wafer is about 10 to about 30 nm, the width L2 of the protruded portion 4 is about 10 to about 30 nm, and an aspect ratio is about 1 to about 20. Also, as a comparative example, a film was formed by using the film formation method described with reference to FIGS. 2 through 4 without the adsorbing step. In other words, a silicon film was directly formed without adsorbing a seed gas on a wafer surface, and a silicon oxide film was formed by oxidizing the silicon film. The results are shown in FIGS. 5A and 5B. FIGS. 5A and 5B are views schematically showing the evaluation results when a film is formed by using the method of the present invention and when a film is formed by using the comparative example.

As shown in FIG. 5A, in the comparative example, a surface of a silicon oxide film formed on a surface of a wafer has very minutely recessed and protruded portions, and thus surface roughness is deteriorated. However, in the method of the present invention, as shown in FIG. 5B, a surface of a silicon oxide film is relatively flat, and thus surface roughness is improved by preventing deterioration of the surface roughness.

Figure 7:
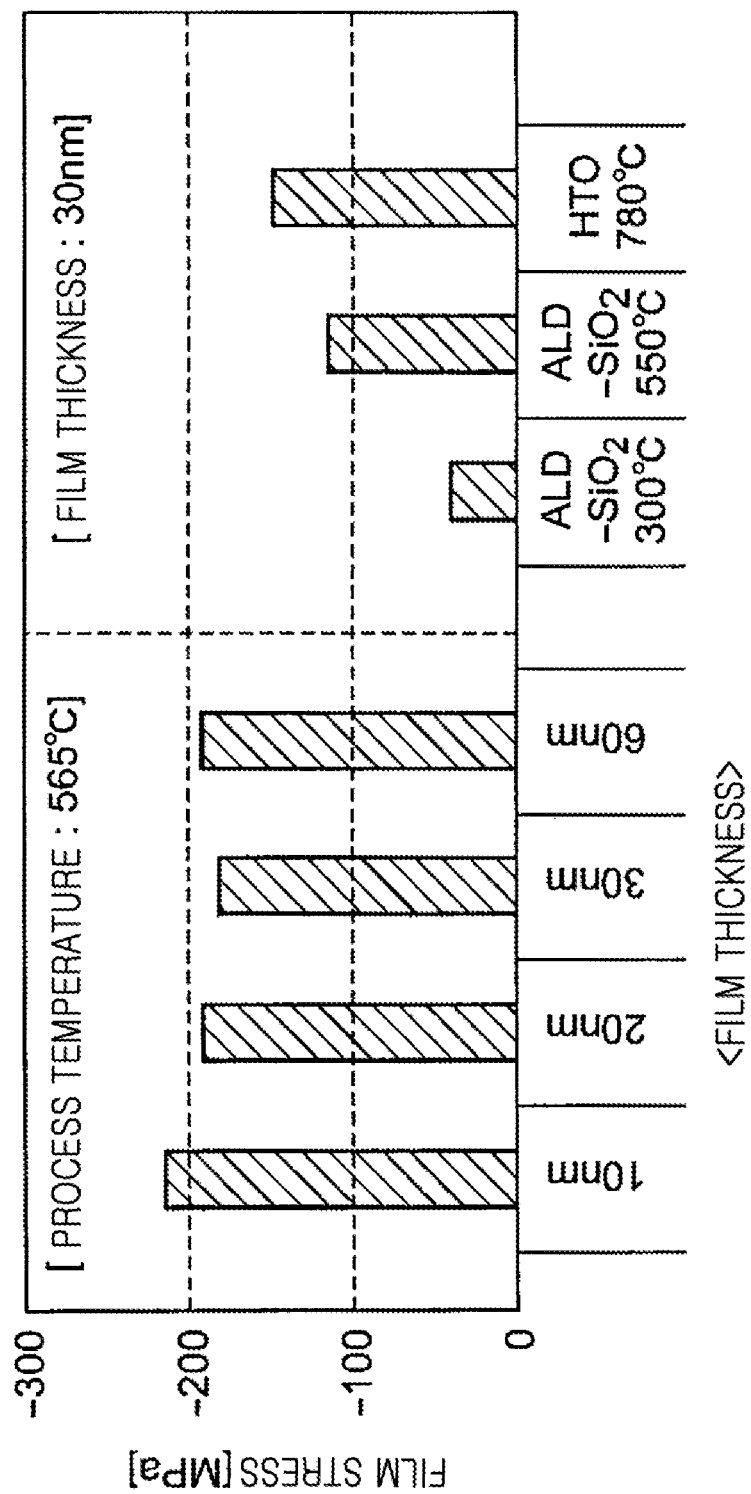
FIG. 7 is a graph showing results of film stresses when a film thickness of a silicon film is changed and a film formation temperature of the silicon film is changed.

Also, while performing the film formation method of the present invention, experiments were performed by changing a film thickness of an amorphous silicon film from 10 to 60 nm (process temperature: 565° C.), and by forming a silicon oxide film (film thickness 30 nm) by changing a film formation temperature during a film formation using an ALD and CVD method, and thus results of film stresses thereof will now be described. FIG. 7 is a graph showing the results of film stresses when a film thickness of a silicon film is changed and a film formation temperature of the silicon film is changed as described above. In FIG. 7, a left part shows the film stress when the film thickness is variously changed, and a right part shows the film stress when the film formation temperature is variously changed. Also, the right part of FIG. 7 is described by referring to a film stress when a silicon oxide film is formed by using an HTO method (CVD oxide film according to a reaction of $SiH_4$ and $N_2O$).

As shown in the left part of FIG. 7, an amorphous silicon film is formed by changing a film thickness, such as 10 nm, 20 nm, 30 nm, and 60 nm. As a result, the film stresses in all film thicknesses have a value from about −210 to about −190 MPa, and thus a high stress is applied regardless of a film thickness and it may be preferable.

Also, as shown in the right part of FIG. 7, a film stress is about −30 MPa when a film formation temperature is 300° C., whereas a film stress increases up to about −110 MPa when a film formation temperature is 550° C. Also, a film stress reaches up to −150 MPa when a film is formed by using the HTO method at a film formation temperature of 780° C. As a result, a high film stress is obtained even at relatively low temperature by using the film formation method of the present invention, compared to a $SiO_2$ film formed by using a conventional ALD method or a $SiO_2$ film formed by using an HTO method.

Here, in the above embodiments, film formation according to an ALD method, wherein a thin film is deposited by repeatedly performing each step, has been described, but the present invention is not limited thereto, and a film may be formed by performing each step once, without repeating each step.

Also, in the above embodiment, trisdimethylaminosilane (TDMAS) was used as the silane-based gas of the seed gas during the adsorbing step, but the silane-based gas is not limited thereto, and an aminosilane-based gas or higher silane, such as disilane, trisilane, tetrasilane, or the like may be used. Here, as the aminosilane-based gas, at least one raw material selected from the group including TDMAS (trisdimethylaminosilane), BAS (butylaminosilane), BTBAS (bistertiarybutylaminosilane), DMAS (dimethylaminosilane), BDMAS (bisdimethylaminosilane), DEAS (diethylaminosilane), BDEAS (bisdiethylaminosilane), DPAS (dipropylaminosilane), and DIPAS (diisopropylaminosilane) may be used.

Also, during the film formation step above, monosilane, i.e., one of silane-based gases, was used as the silicon-containing gas that is the material gas, but the silicon-containing gas is not limited thereto, and an aminosilane-based gas, such as trisdimethylaminosilane, or the like described above, higher silane, such as disilane, trisilane, tetrasilane, or the like, or $SiH_2Cl_2$, $Si_2Cl_6$, or the like may be used in addition to monosilane.

Further, an $N_2O$ gas, i.e., one of nitrogen oxide-based gases, is used as the addition gas during the film formation step, but the addition gas is not limited thereto, and another nitrogen oxide-based gas or a hydrocarbon-based gas may be used. Here, an NO gas may be used as another nitrogen oxide-based gas. Also, acetylene, ethylene, methane, ethane, propane, butane, or the like may be used as the hydrocarbon-based gas, and at this time, the impurity is carbon (C).

Also, oxygen radicals and hydroxyl radicals generated from $H_2$ and $O_2$ were used to oxidize a silicon film during the oxidizing step, but as described above, a method of using oxygen plasma or a method of using ozone may be employed.

Here, in the method of using oxygen plasma, a remote plasma method of generating active species by plasmatizing oxygen with high frequency power by using, for example, a process apparatus disclosed in Japanese Patent Laid-Open Publication No. 2006-287194 may be employed. In this case, a frequency of the high frequency power may be, for example, 13.56 MHz, and the high frequency power is within the range from 50 to 500 W (watts). Also, a process pressure is within the range from 0.1 to 10 Torr, and a supply amount of oxygen is within the range from 500 to 10000 sccm.

Also, when the method of using ozone is used, an oxygen flow rate is 1 to 10 slm so that an ozone ($O_3$) concentration is within the range from 50 to 500 g/m$^3$ and a process pressure is within the range from 0.1 to 10 Torr.

Also, the film formation apparatus shown in FIG. 1 was described with an example of a film formation apparatus of a one pipe system, wherein the process chamber 14 has a structure of one cylindrical shape, but the film formation apparatus is not limited thereto, and a film formation apparatus using a process chamber of a double pipe structure in which an inner container and an outer container surrounding the inner container are provided may be used in the present invention.

Further, the film formation apparatus of the present invention is not limited to a so-called batch type film formation apparatus capable of processing a plurality of semiconductor wafers at the same time, and may be embodied as a so-called single wafer type process apparatus that processes one semiconductor wafer at a time.

Also, herein, a semiconductor wafer is used as an example of an object to be processed, and the semiconductor wafer includes a silicon substrate or a compound semiconductor substrate, such as GaAs, SiC, GaN, or the like. In addition, the semiconductor wafer is not limited to these substrates, and may be a glass substrate, a ceramic substrate, or the like, which is used in a liquid crystal display device.

The film formation method and the film formation apparatus of the present invention may show a following excellent effect.

It is possible to form a silicon oxide film having a high density and a high stress on a surface of an object to be processed, and as a result, for example, if a minutely recessed and protruded pattern exists on the surface of the object to be processed, deformation of the recessed and protruded pattern may be suppressed.

What is claimed is:
1. A film formation method of forming a silicon oxide film on a surface of an object to be processed in a process chamber, the film formation method comprising:
adsorbing a seed gas comprising a silane-based gas to form a seed layer on the surface of the object to be processed by supplying the seed gas into the process chamber;
forming an amorphous silicon film having an impurity on the seed layer by supplying a silicon-containing gas as a material gas, and an addition gas including the impurity into the process chamber; and
oxidizing the amorphous silicon film to convert the amorphous silicon film into the silicon oxide film, wherein the adsorbing of the seed gas, the forming of the amorphous silicon film, and the oxidizing of the amorphous silicon film are repeatedly performed in the described order.

2. The film formation method of claim 1, wherein the seed gas comprises an aminosilane-based gas or a higher silane-based gas.

3. The film formation method of claim 1, wherein the silicon-containing gas comprises a silane-based gas.

4. The film formation method of claim 1, wherein the addition gas comprises a nitrogen oxide-based gas or a hydrocarbon-based gas.

5. The film formation method of claim 1, wherein the oxidizing of the amorphous silicon film is performed by using active species of at least oxygen.

6. A film formation apparatus which forms a silicon oxide film on a surface of an object to be processed, the film formation apparatus comprising:
   a process chamber which is able to be evacuated;
   a holding unit which holds the object to be processed in the process chamber;
   a gas supply unit which supplies a gas into the process chamber;
   a heating unit which heats the object to be processed; and
   a controller which controls the entire apparatus so as to perform the film formation method of claim 1.

* * * * *